United States Patent
Hori et al.

(10) Patent No.: US 8,642,154 B2
(45) Date of Patent: Feb. 4, 2014

(54) SILICON CARBIDE CRYSTAL INGOT, SILICON CARBIDE CRYSTAL WAFER, AND METHOD FOR FABRICATING SILICON CARBIDE CRYSTAL INGOT

(75) Inventors: Tsutomu Hori, Itami (JP); Makoto Sasaki, Itami (JP); Taro Nishiguchi, Itami (JP); Shinsuke Fujiwara, Itami (JP)

(73) Assignee: Sumitomo Electric Insustries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/475,360

(22) Filed: May 18, 2012

(65) Prior Publication Data

US 2012/0308758 A1 Dec. 6, 2012

Related U.S. Application Data

(60) Provisional application No. 61/492,022, filed on Jun. 1, 2011.

(30) Foreign Application Priority Data

Jun. 1, 2011 (JP) ................................. 2011-123040

(51) Int. Cl.
*B32B 3/02* (2006.01)

(52) U.S. Cl.
USPC ........ 428/64.1; 117/19; 117/21; 252/301.4 R; 252/512

(58) Field of Classification Search
USPC ........ 428/64.1; 117/19, 21; 252/301.4 R, 512
See application file for complete search history.

(56) References Cited

U.S. PATENT DOCUMENTS

2002/0104478 A1 8/2002 Oguri et al.
2011/0024766 A1* 2/2011 Jenny et al. ............... 257/77

FOREIGN PATENT DOCUMENTS

JP 3876628 2/2007

* cited by examiner

*Primary Examiner* — Elizabeth Mulvaney
(74) *Attorney, Agent, or Firm* — Drinker Biddle & Reath LLP

(57) ABSTRACT

A silicon carbide crystal ingot having a surface greater than or equal to 4 inches, having an n-type dopant concentration greater than or equal to $1 \times 10^{15}$ atoms/cm$^3$ and less than or equal to $1 \times 10^{20}$ atoms/cm$^3$, a metal atom concentration greater than or equal to $1 \times 10^{14}$ atoms/cm$^3$ and less than or equal to $1 \times 10^{18}$ atoms/cm$^3$, and not exceeding the n-type dopant concentration, and a metal atom concentration gradient less than or equal to $1 \times 10^{17}$ atoms/(cm$^3$·mm), a silicon carbide single crystal wafer produced using the ingot, and a method for fabricating the silicon carbide crystal ingot.

6 Claims, 2 Drawing Sheets

SILICON CARBIDE CRYSTAL INGOT, SILICON CARBIDE CRYSTAL WAFER, AND METHOD FOR FABRICATING SILICON CARBIDE CRYSTAL INGOT

This application claims the benefit of U.S. Provisional Application No. 61/492,022 filed Jun. 1, 2011, which is incorporated herein in the entirety.

BACKGROUND OF THE INVENTION

1. Field of the Invention

The present invention relates to a silicon carbide crystal ingot, a silicon carbide crystal wafer, and a method for fabricating a silicon carbide crystal ingot.

2. Description of the Background Art

In recent years, the usage of silicon carbide (SiC) single crystal for a semiconductor substrate employed in fabricating a semiconductor device is in progress. SiC is known to have a band gap greater than that of silicon (Si) that has been used more commonly. Therefore, a semiconductor device employing SiC is drawing attention by having advantages such as high breakdown voltage, low ON resistance, and less degradation in properties under high-temperature environment.

For example, PTL 1 (U.S. Pat. No. 3,876,628) discloses the method of growing a SiC single crystal ingot through sublimation upon introducing n-type dopant atoms having an atomic radius smaller than that of silicon together with heavy metal atoms such as titanium, vanadium, or tantalum having an atomic radius larger than that of silicon into a SiC single crystal ingot.

According to the method of PTL 1, the strain in the SiC single crystal ingot can be alleviated by canceling the compression strain generated in the SiC single crystal ingot caused by introducing n-type dopant atoms having an atomic radius smaller than that of silicon by the introduction of heavy metal atoms having an atomic radius larger than that of silicon (for example, refer to Paragraphs [0038]-[0046] PTL 1).

SUMMARY OF THE INVENTION

According to the method disclosed in the aforementioned PTL 1, metal single substance of heavy metal atoms such as titanium, vanadium, or tantalum, or a compound thereof (metal compound such as oxide or sulfide with heavy metal as the main component) is added to the SiC raw material powder to grow a SiC single crystal ingot on the seed crystal by sublimation.

However, metal single substance of heavy metal atoms or a compound thereof (metal compound such as oxide or sulfide with heavy metal as the main component) does not readily sublimate, and not so much heavy metal atoms are taken into the SiC single crystal ingot at the initial stage of growing the SiC single crystal ingot. Therefore, there will be difference in concentration of the heavy metal atoms in the thickness direction of the SiC single crystal ingot. In other words, the concentration of the heavy metal atoms is low in the region of the grown SiC single crystal ingot at the side in proximity to the seed crystal, and becomes higher as a function of distance from the seed crystal.

In the case where a SiC single crystal wafer is produced by cutting out from a SiC single crystal ingot obtained according to the method disclosed in PTL 1, warpage at the SiC single crystal wafer due to difference in the concentration of the heavy metal atoms does not readily occur when the diameter of the SiC single crystal wafer is small.

However, in the case where a large-diameter SiC single crystal wafer of 4 or more inches in diameter, for example, is produced by cutting out from a SiC single crystal ingot obtained by the method disclosed in PTL 1 to meet the recent demands of a SiC single crystal wafer with a large diameter, there is a problem that warpage occurs at the SiC single crystal wafer due to the concentration difference of the heavy metal atoms between the top face and bottom face of the SiC single crystal wafer.

In view of the foregoing, an object of the present invention is to provide a silicon carbide crystal ingot that can have the strain therein alleviated and warpage at a silicon carbide crystal wafer, even when formed having a large diameter, reduced, a silicon carbide crystal wafer, and a method for fabricating a silicon carbide crystal ingot.

The present invention is directed to a silicon carbide crystal ingot having a surface greater than or equal to 4 inches in diameter, including an n-type dopant, and a metal atom having an atomic radius larger than the atomic radius of silicon. The concentration of the n-type dopant is greater than or equal to $1 \times 10^{15}$ atoms/cm$^3$, and less than or equal to $1 \times 10^{20}$ atoms/cm$^3$. The concentration of the metal atom is greater than or equal to $1 \times 10^{14}$ atoms/cm$^3$, and less than or equal to $1 \times 10^{18}$ atoms/cm$^3$, as well as not exceeding the concentration of the n-type dopant. The concentration gradient of the metal atom is less than or equal to $1 \times 10^{17}$ atoms/(cm$^3 \cdot$mm).

The present invention is also directed to a silicon carbide crystal wafer having a surface greater than or equal to 4 inches in diameter, obtained by being cutting out from the silicon carbide crystal ingot set forth above.

Preferably, the silicon carbide crystal wafer of the present invention has a thickness greater than or equal to 100 μm, and less than or equal to 2000 μm. The difference between the maximum value and minimum value of the angle between the surface of the silicon carbide crystal wafer and a normal line of a low-index plane substantially parallel to the surface of the silicon carbide crystal wafer is less than or equal to 0.5°.

The off angle of the silicon carbide crystal wafer of the present invention is preferably greater than or equal to 1° to the surface of the seed crystal.

Further, the present invention is directed to a method for fabricating a silicon carbide crystal ingot including the steps of acid-cleaning raw material powder including a metal atom having an atomic radius larger than the atomic radius of silicon as at least one of an interstitial atom and substitutional atom in the crystal of silicon carbide powder, and vapor-phase growing a silicon carbide crystal ingot using the raw material powder after the step of acid-cleaning.

According the present invention, there can be provided a silicon carbide crystal ingot that can have the strain therein alleviated and warpage at a silicon carbide crystal wafer, even when formed having a large diameter, suppressed, a silicon carbide crystal wafer, and a method for fabricating a silicon carbide crystal ingot.

The aforementioned and other objects, features, aspects and advantages of the present invention will become apparent from the detailed description set forth below related to the present invention in association with the attached drawings.

DESCRIPTION OF THE PREFERRED EMBODIMENTS

An example of a method for fabricating a silicon carbide crystal ingot of the present invention will be described hereinafter. Another step may be included before or after each of the steps set forth below.

<Step of Acid-Cleaning Raw Material Powder>

First is carried out the step of acid-cleaning raw material powder including a metal atom having an atomic radius larger than that of silicon as at least one of an interstitial atom (an atom present in the crystal lattice of silicon carbide crystal) and substitutional atom (atom present by substituting for the silicon atom in the crystal lattice of silicon carbide crystal) in the crystal of the silicon carbide powder.

The method of obtaining the aforementioned raw material powder may include the step of mixing metal powder into commercially available raw material powder, followed by sublimation, and pulverizing the recrystallized result.

The step of acid-cleaning raw material powder can be performed by immersion of raw material powder into at least one type of acid selected from the group consisting of aqua regia, hydrochloric acid, nitric acid, and sulfuric acid.

For the acid employed in acid-cleaning, aqua regia is preferable. In the case where aqua regia is used as the acid in acid-cleaning, a metal single substance of heavy metal atom such as titanium, vanadium, tantalum, or the like included slightly in the raw material powder, or a compound thereof (metal compound such as oxide or sulfide with heavy metal as the main component) can be removed efficiently.

The immersion time of raw material powder in the acid is preferably greater than or equal to 120 minutes and less than or equal to 3600 minutes. When the immersion time is greater than or equal to 120 minutes and less than or equal to 3600 minutes, the metal single substance of heavy metal atom such as titanium, vanadium, tantalum, or the like included slightly in the raw material powder, or a compound thereof (metal compound such as oxide or sulfide with heavy metal as the main component) can be sufficiently removed.

<Step of Vapor-Phase Growing Silicon Carbide Crystal Ingot>

After the step of acid-cleaning raw material powder is carried out, the step of vapor-phase growing a silicon carbide crystal ingot using the raw material powder is carried out.

Figure 1:
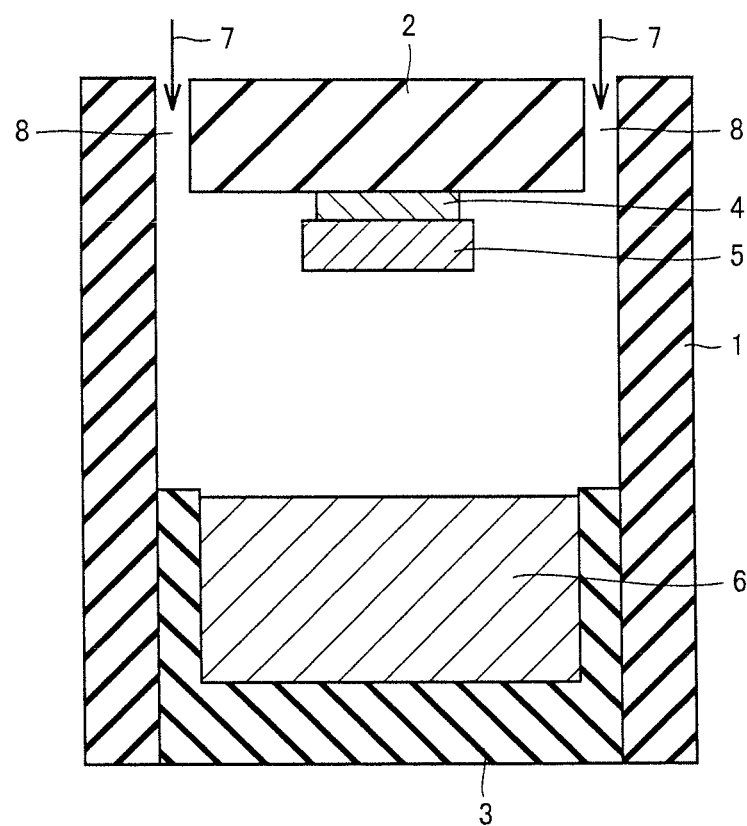
FIG. 1 is a schematic sectional view of an example of a fabrication apparatus of a silicon carbide crystal ingot of the present invention.

FIG. 1 is a schematic sectional view of an example of a silicon carbide crystal ingot fabrication apparatus of the present invention. The fabrication apparatus of FIG. 1 includes a graphite vessel 1, a graphite base 2 provided at the upper portion of graphite vessel 1, a graphite crucible 3 provided at the lower portion of graphite vessel 1, and seed crystal 4 made of SiC single crystal, having a surface greater than or equal to 4 inches in diameter and provided at graphite base 2.

In graphite vessel 1, graphite base 2 located at the upper portion and graphite crucible 3 located at the lower portion of graphite vessel 1 are provided to face each other. Gas is supplied from an external source into graphite vessel 1. An opening 8 to discharge gas outside is provided at graphite base 2.

The fabrication apparatus of FIG. 1 includes a vacuum vessel (not shown) in which graphite vessel 1 is placed, and is configured to control the atmosphere and pressure in graphite vessel 1 by connecting the vacuum vessel to a vacuum discharge system and gas supply system.

A heater (not shown) that can heat the atmosphere in graphite vessel 1 is arranged around graphite vessel 1. The temperature of the atmosphere in graphite vessel 1 can be adjusted by regulating the power to the heater.

An example of the step of vapor-phase growing a silicon carbide crystal ingot using the fabrication apparatus of FIG. 1 will be described hereinafter. First, graphite crucible 3 of FIG. 1 is filled with raw material powder 6 obtained through the acid-cleaning step set forth above.

Raw material powder 6 includes a metal atom having an atomic radius larger than that of silicon as at least one of an interstitial atom and substitutional atom, in the crystal of silicon carbide powder.

For the metal atom, the atom of a metal other than light metal (metal having a density less than 4 $g/cm^3$ such as sodium, potassium, calcium, scandium) having an atomic radius larger than that of silicon are employed. For such metal atoms, the atom of a metal having an atomic radius larger than or equal to 0.117 nm and less than or equal to 0.16 nm can be employed. Particularly, using at least one type selected from the group consisting of titanium (atomic radius: 0.146 nm), vanadium (atomic radius: 0.135 nm) and tantalum (atomic radius: 0.147 nm) is preferable. When at least one type selected from the group consisting of titanium, vanadium, and tantalum is employed as the metal atom, the strain generated in the silicon carbide crystal ingot that has been vapor-phase grown on the surface of seed crystal 4 can be alleviated effectively.

Then, inert gas is introduced into graphite vessel 1 from opening 8 at the upper portion of graphite vessel 1. For the inert gas, at least one type selected from the group consisting of argon, helium and nitrogen, for example, can be introduced.

Then, the interior or graphite crucible 3 is heated by the heater provided at the outer circumference of graphite vessel 1. At this stage, the interior of graphite crucible 3 is heated to a temperature greater than or equal to 2000° C. and less than or equal to 2500° C., for example, to exhibit a temperature gradient becoming lower from the side of raw material powder 6 towards the side of seed crystal 4.

Then, the pressure of the atmosphere in graphite vessel 1 is reduced. At the point in time when the pressure of the atmosphere in graphite vessel 1 attains a predetermined pressure (for example, greater than or equal to 13.3 Pa and less than or equal to 13.3 kPa), vapor deposition of silicon carbide single crystal ingot 5 by sublimation is initiated.

At this stage, raw material gas including at least one type selected from the group consisting of Si, $SiC_2$ and $Si_2C$, for example, is generated from the silicon carbide powder of raw material powder 6 by sublimation thereof. Moreover, gas including metal atoms contained in raw material powder 6 is generated from the metal single substance and/or metal compound of raw material powder 6.

From opening 8 located at the upper portion of graphite vessel 1, dopant gas 7 including an n-type dopant such as nitrogen or phosphorus, having an atomic radius smaller than that of silicon, is introduced into graphite vessel 1.

Accordingly, silicon carbide single crystal ingot 5 having a surface greater than or equal to 4 inches in diameter is vapor-phase grown by sublimation on the surface of seed crystal 4 located at the upper portion of graphite vessel 1. A metal atom having an atomic radius larger than that of silicon is taken into silicon carbide single crystal ingot 5 together with an n-type dopant such as nitrogen or phosphorus having an atomic radius smaller than that of silicon.

The n-type dopant such as nitrogen or phosphorus taken into silicon carbide single crystal ingot 5 reduces the resistance of silicon carbide single crystal ingot 5. Since the nitrogen entering the C site of silicon carbide single crystal ingot 5 has an atomic radius smaller than that of carbon and the phosphorus entering the Si site has an atomic radius smaller than that of silicon, the introduction of n-type dopant having an atomic radius smaller than that of silicon into silicon carbide single crystal ingot 5 functions in the direction compressing silicon carbide single crystal ingot 5 to cause crystal strain.

It is to be noted that the metal atom taken in silicon carbide single crystal ingot 5, when introduced into the Si site of silicon carbide single crystal ingot 5 to be substituted for silicon, and/or introduced in the lattice of silicon carbide single crystal ingot 5, will function in the direction to expand silicon carbide single crystal ingot 5 due to the larger atomic radius than silicon.

At silicon carbide single crystal ingot 5 formed by introducing dopant gas 7 including an n-type dopant having an atomic radius smaller than that of silicon such as nitrogen or phosphorus into graphite vessel 1 and sublimating raw material powder 6 including silicon carbide powder and metal atoms having an atomic radius larger than that of silicon, the compression strain in silicon carbide single crystal ingot 5 caused by introduction of the n-type dopant can be cancelled by the introduction of metal atoms. Therefore, there is provided the advantage of alleviating the strain in silicon carbide single crystal ingot 5.

Further, the alleviation of internal strain in silicon carbide single crystal ingot 5 serves to suppress occurrence of polymorphism such as 15R type silicon carbide single crystal caused by reduction in the crystal face distance due to the compression strain at the time of crystal growth of 6H type silicon carbide single crystal ingot 5, for example.

<Silicon Carbide Single Crystal Ingot>

Silicon carbide single crystal ingot 5 having a surface greater than or equal to 4 inches in diameter, grown as set forth above, satisfies all the three conditions of (i), (ii) and (iii) below.

(i) The concentration of n-type dopant in silicon carbide single crystal ingot 5 is greater than or equal to $1 \times 10^{15}$ atoms/cm$^3$ and less than or equal to $1 \times 10^{20}$ atoms/cm$^3$.

(ii) The concentration of metal atom in silicon carbide single crystal ingot 5 is greater than or equal to $1 \times 10^{14}$ atoms/cm$^3$ and less than or equal to $1 \times 10^{18}$ atoms/cm$^3$, and not exceeding the concentration of n-type dopant.

(iii) The concentration gradient of the metal atom in silicon carbide single crystal ingot 5 is less than or equal to $1 \times 10^{17}$ atoms/(cm$^3$·mm).

By meeting the condition of (i), silicon carbide single crystal ingot 5 has favorable low resistance and favorable crystallinity.

By meeting the condition of (ii), the compression strain occurring in silicon carbide single crystal ingot 5 due to the introduction of n-type dopant can be alleviated effectively.

By meeting the condition of (iii), any warpage occurring at a silicon carbide single crystal wafer of even a large diameter having a surface greater than or equal to 4 inches in diameter, when produced by being cutting out from silicon carbide single crystal ingot 5, can be reduced.

The concentration of the n-type dopant and the metal atom in silicon carbide single crystal ingot 5 each can be measured by SIMS (Secondary Ion-microprobe Mass Spectrometry), or the like.

The concentration gradient of the metal atom in silicon carbide single crystal ingot 5 under the aforementioned condition of (iii) can be measured as set forth below, for example.

Figure 2:
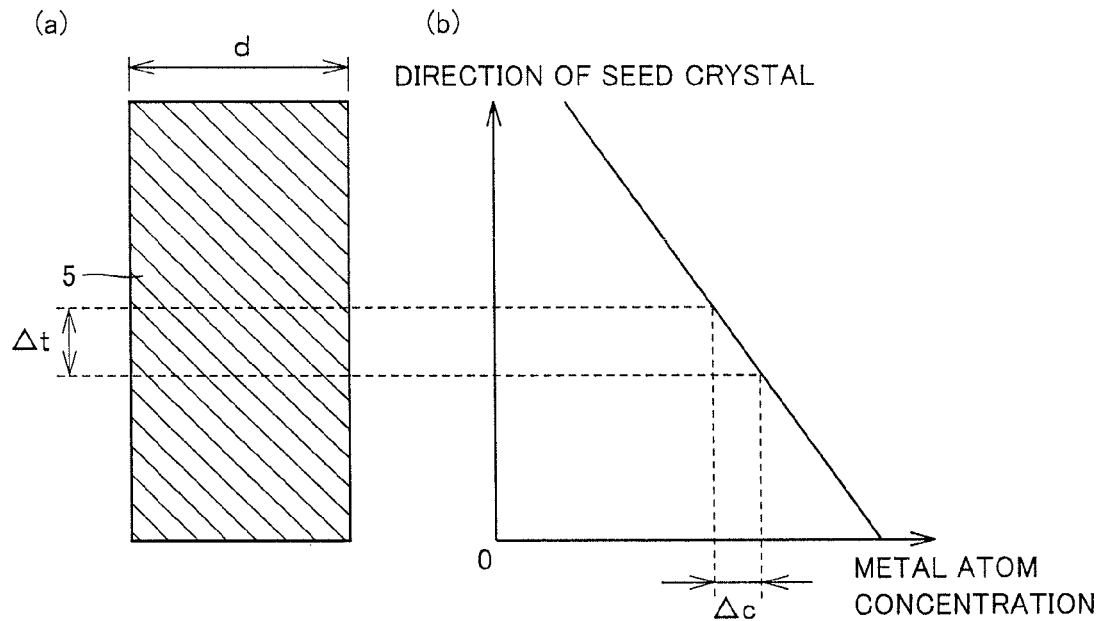
FIG. 2 (*a*) represents a schematic sectional view of an example of a silicon carbide crystal ingot of the present invention, and FIG. 2 (b) represents the metal atom concentration gradient in the silicon carbide crystal ingot of FIG. 2 (a).

FIG. 2 (a) represents a schematic sectional view of an example of silicon carbide single crystal ingot 5 of the present invention, and FIG. 2 (b) represents the metal atom concentration gradient in silicon carbide single crystal ingot 5 of FIG. 2 (a).

The diameter d at the surface of silicon carbide single crystal ingot 5 shown in FIG. 2 (a) is greater than or equal to 4 inches. The amount of change Δc [atoms/cm$^3$] of the metal atom concentration to the amount of change Δt [mm] of a predetermined thickness of silicon carbide single crystal ingot 5 shown in FIG. 2 (a) is obtained. The concentration gradient of the metal atom in silicon carbide single crystal ingot 5 can be calculated by following equation (I).

$$\text{Metal atom concentration gradient [atoms/(cm}^3\cdot\text{mm)]} = |\Delta c/\Delta t| \quad (I)$$

<Silicon Carbide Single Crystal Wafer>

Figure 3:
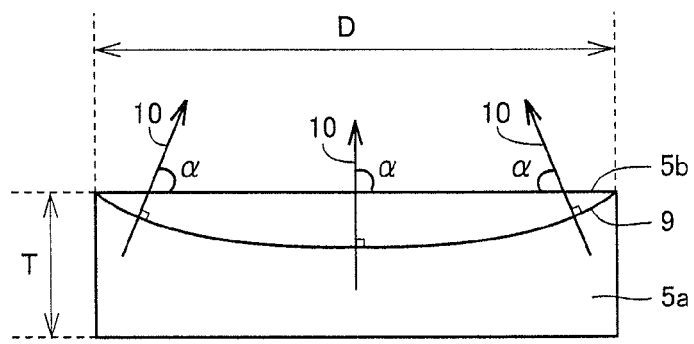
FIG. 3 is a schematic sectional view of an example of a silicon carbide single crystal wafer of the present invention.

FIG. 3 is a schematic sectional view of an example of a silicon carbide single crystal wafer of the present invention. Silicon carbide single crystal wafer 5a shown in FIG. 3 can be produced by cutting out a portion of silicon carbide single crystal ingot 5 grown as set forth above in a direction orthogonal to the growing direction thereof using a wire saw or the like. The diameter D at a surface 5b of silicon carbide single crystal wafer 5a produced as described above is greater than or equal to 4 inches.

The thickness T of silicon carbide single crystal wafer 5a produced as set forth above is not particularly limited. The warpage at silicon carbide single crystal wafer 5a of the present invention is reduced in spite of having a surface 5b greater than or equal to 4 inches in diameter D. Accordingly, the difference between the maximum value and minimum value of an angle α between surface 5b of silicon carbide single crystal wafer 5a and a normal line 10 of a low-index plane 9 substantially parallel to surface 5b of silicon carbide single crystal wafer 5a, when thickness T of silicon carbide single crystal wafer 5a of the present invention is greater than or equal to 100 μm and less than or equal to 2000 μm, can be set to be less than or equal to 0.5°.

Low-index plane 9 implies a crystal face substantially parallel to and located closest to surface 5b of silicon carbide single crystal wafer 5a. "Substantially parallel to surface 5b of silicon carbide single crystal wafer 5a" means that the angle to surface 5b of silicon carbide single crystal wafer 5a is less than or equal to 0.5°.

Figure 4:
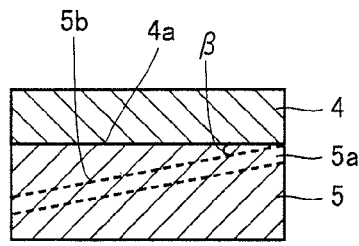
FIG. 4 is a schematic sectional view illustrating an example of the off angle at a silicon carbide single crystal wafer of the present invention.

As schematically shown in the sectional view of FIG. 4, the off angle β of silicon carbide single crystal wafer 5a (the angle between surface 5a of silicon carbide single crystal wafer 5a and surface 4a of seed crystal 4) is preferably greater than or equal to 1° to surface 4a of seed crystal 4. In this case, there is a tendency to facilitate growing homoepitaxially silicon carbide crystal on silicon carbide single crystal wafer 5a during the production of a silicon carbide semiconductor device using silicon carbide single crystal wafer 5a.

In the foregoing, all the angles take a value greater than or equal to 0° and less than or equal to 90°. Any angle exceeding the aforementioned angle is taken as a supplementary angle.

The degree of the supplementary angle is not included in the value of the angle set forth above.

EXAMPLE

Example 1

Raw material powder including titanium having an atomic radius larger than that of silicon as at least one of an interstitial atom and substitutional atom in silicon carbide crystal of the silicon carbide powder was immersed in aqua regia for more than or equal to 120 minutes and less than or equal to 3600 minutes to perform acid-cleaning of the raw material powder.

Then, inert gas of He was introduced into graphite vessel 1 through opening 8 at the upper region of the fabrication apparatus shown in FIG. 1. The pressure in graphite vessel 1 was 66.6 kPa.

The atmosphere in graphite vessel 1 was heated using a heater (not shown) provided around the fabrication apparatus of FIG. 1 such that the temperature of raw material powder 6 became 2300° C. and the temperature of seed crystal 4 became 2200° C. The heating of the atmosphere in graphite vessel 1 was carried out to attain a temperature gradient in which the temperature in graphite vessel 1 is reduced linearly from raw material powder 6 towards seed crystal 4.

Then, the pressure in graphite vessel 1 was gradually reduced to 13.3 kPa. At the point in time when the pressure in graphite vessel 1 reached 13.3 kPa, dopant gas 7 of nitrogen was introduced into graphite vessel 1 together with the inert gas of He. As used herein, nitrogen was mixed into the inert gas to attain the ratio of 5 volume % of the inert gas of He for introduction into graphite vessel 1.

Thus, there was grown on the Si face of seed crystal 4 silicon carbide single crystal ingot 5 of Example 1 made of 6H type silicon carbide single crystal, and having a surface greater than or equal to 4 inches in diameter.

The nitrogen concentration [atoms/cm$^3$] and titanium atom concentration [atoms/cm$^3$] of silicon carbide single crystal ingot 5 of Example 1 produced as set forth above were measured by SIMS. From the measured result of titanium atom concentration, the titanium atom concentration gradient [atoms/(cm$^3$·mm)] of silicon carbide single crystal ingot 5 of Example 1 was calculated. The results are shown in Table 1.

It is appreciated from Table 1 that the nitrogen concentration in silicon carbide single crystal ingot 5 of Example 1 was $1 \times 10^{19}$ [atoms/cm$^3$] and the titanium atom concentration was $1 \times 10^{16}$ [atoms/cm$^3$]. The titanium atom concentration gradient was $1 \times 10^{16}$ [atoms/(cm$^3$·mm)].

Silicon carbide single crystal ingot 5 of Example 1 produced as set forth above was cut to a thickness of 400 μm by a wire saw to produce a silicon carbide single crystal wafer of Example 1 having a surface greater than or equal to 4 inches in diameter. The silicon carbide single crystal wafer of Example 1 was produced by being cut such that the off angle was greater than or equal to 1° to the surface of the seed crystal.

To evaluate the degree of warpage at the silicon carbide single crystal wafer of Example 1, the difference between the maximum value and minimum value of the angle between the surface of the silicon carbide single crystal wafer of Example 1 and the normal line of the low-index plane substantially parallel to the surface was calculated. The result is shown in Table 1. It is appreciated from Table 1 that the difference at the silicon carbide single crystal wafer of Example 1 was 0.2°.

A smaller difference thereof implies that the warpage at the silicon carbide single crystal wafer is smaller.

The aforementioned difference was calculated by measuring the in-plane distribution of the diffraction angle of diffracted X-ray obtained by having the surface of the silicon carbide single crystal wafer of Example 1 incident with an X-ray.

Example 2

A silicon carbide single crystal ingot 5 of Example 2 having a surface greater than or equal to 4 inches in diameter was grown in a manner similar to that of Example 1 except that the content of metal titanium (Ti) in the raw material powder was reduced.

The nitrogen concentration [atoms/cm$^3$] and titanium atom concentration [atoms/cm$^3$] as well as the titanium atom concentration gradient [atoms/(cm$^3$·mm)] of silicon carbide single crystal ingot 5 of Example 2 produced as set forth above were obtained. The results are shown in Table 1.

It is appreciated from Table 1 that the nitrogen concentration in silicon carbide single crystal ingot 5 of Example 2 was $1 \times 10^{19}$ [atoms/cm$^3$] and the titanium atom concentration was $5 \times 10^{16}$ [atoms/cm$^3$]. The titanium atom concentration gradient was $5 \times 10^{15}$ [atoms/(cm$^3$·mm)].

Silicon carbide single crystal ingot 5 of Example 2 produced as set forth above was cut to a thickness of 400 μm by a wire saw to produce a silicon carbide single crystal wafer of Example 2 having a surface greater than or equal to 4 inches in diameter.

To evaluate the degree of warpage at the silicon carbide single crystal wafer of Example 2, the difference between the maximum value and minimum value of the angle between the surface of the silicon carbide single crystal wafer of Example 2 and the normal line of the low-index plane substantially parallel to the surface was calculated, likewise with Example 1. The result is shown in Table 1. It is appreciated from Table 1 that the difference at the silicon carbide single crystal wafer of Example 2 was 0.2°.

Example 3

A silicon carbide single crystal ingot 5 of Example 3 having a surface greater than or equal to 4 inches in diameter was grown in a manner similar to that of Example 1 except that the content of metal titanium (Ti) in the raw material powder was further reduced than in Example 2.

The nitrogen concentration [atoms/cm$^3$] and titanium atom concentration [atoms/cm$^3$] as well as the titanium atom concentration gradient [atoms/(cm$^3$·mm)] of silicon carbide single crystal ingot 5 of Example 3 produced as set forth above were obtained. The results are shown in Table 1.

It is appreciated from Table 1 that the nitrogen concentration in silicon carbide single crystal ingot 5 of Example 3 was $1 \times 10^{19}$ [atoms/cm$^3$] and the titanium atom concentration was $3 \times 10^{16}$ [atoms/cm$^3$]. The titanium atom concentration gradient was $1 \times 10^{15}$ [atoms/(cm$^3$·mm)].

To evaluate the degree of warpage at the silicon carbide single crystal wafer of Example 3, the difference between the maximum value and minimum value of the angle between the surface of the silicon carbide single crystal wafer of Example 3 and the normal line of the low-index plane substantially parallel to the surface was calculated, likewise with Example 1. The result is shown in Table 1. It is appreciated from Table 1 that the difference at the silicon carbide single crystal wafer of Example 3 was 0.2°.

Comparative Example 1

A silicon carbide single crystal ingot 5 of Comparative Example 1 having a surface greater than or equal to 4 inches in diameter was grown in a manner similar to that of Example 1 provided that the content of titanium metal (Ti) in the raw material powder was increased as compared with that of Example 1.

The nitrogen concentration [atoms/cm$^3$] and titanium atom concentration [atoms/cm$^3$] as well as the titanium atom concentration gradient [atoms/(cm$^3$·mm)] of silicon carbide single crystal ingot 5 of Comparative Example 1 produced as set forth above were obtained. The results are shown in Table 1.

It is appreciated from Table 1 that the nitrogen concentration in silicon carbide single crystal ingot 5 of Comparative Example 1 was 1×10$^{19}$ [atoms/cm$^3$] and the titanium atom concentration was 1×10$^{19}$ [atoms/cm$^3$]. The titanium atom concentration gradient was 1×10$^{18}$ [atoms/(cm$^3$·mm)].

To evaluate the degree of warpage at the silicon carbide single crystal wafer of Comparative Example 1, the difference between the maximum value and minimum value of the angle between the surface of the silicon carbide single crystal wafer of Comparative Example 1 and the normal line of the low-index plane substantially parallel to the surface was calculated, likewise with Example 1. The result is shown in Table 1. It is appreciated from Table 1 that the difference at the silicon carbide single crystal wafer of Comparative Example 1 was 4°.

<Results>

TABLE 1

| | Example 1 | Example 2 | Example 3 | Comparative Example 1 |
|---|---|---|---|---|
| Nitrogen concentration [atoms/cm$^3$] | 1 × 10$^{19}$ | 1 × 10$^{19}$ | 1 × 10$^{19}$ | 1 × 10$^{19}$ |
| Titanium atom concentration [atoms/cm$^3$] | 1 × 10$^{16}$ | 5 × 10$^{16}$ | 3 × 10$^{16}$ | 1 × 10$^{19}$ |
| Titanium atom concentration gradient [atoms/(cm$^3$ · mm)] | 1 × 10$^{16}$ | 5 × 10$^{15}$ | 1 × 10$^{15}$ | 1 × 10$^{18}$ |
| Difference [°] between maximum value and minimum value of angle between wafer surface and normal line of low-index plane | 0.2 | 0.2 | 0.2 | 4 |

It was confirmed from Table 1 that the silicon carbide single crystal wafer of Examples 1-3 produced by being cutting out from the silicon carbide single crystal ingot of Examples 1-3 having a nitrogen concentration greater than or equal to 1×10$^{15}$ atoms/cm$^3$ and less than or equal to 1×10$^{20}$ atoms/cm$^3$, a titanium atom concentration greater than or equal to 1×10$^{14}$ atoms/cm$^3$ and less than or equal to 1×10$^{18}$ atoms/cm$^3$, and not exceeding the nitrogen concentration, and a titanium atom concentration gradient greater than or equal to 1×10$^{16}$ atoms/(cm$^3$·mm) and less than or equal to 1×10$^{17}$ atoms/(cm$^3$·mm) had warpage reduced as compared to the silicon carbide single crystal wafer of Comparative Example 1 having a titanium atom concentration gradient not within the range of 1×10$^{16}$ atoms/(cm$^3$·mm) to 1×10$^{17}$ atoms/(cm$^3$·mm). This is probably because the silicon carbide single crystal ingot of Comparative Example 1 had a titanium atom concentration gradient so great that the warpage at the silicon carbide single crystal wafer could not be reduced sufficiently.

Although Examples 1-3 and Comparative Example 1 set forth above were described corresponding to the case where metal titanium. (Ti) was employed as the metal atom, a result similar to that set forth above was obtained even in the case where titanium nitride (TiN), vanadium (V), vanadium nitride (VN), vanadium carbide (VC), tantalum (Ta), tantalum carbide (TaC) or tantalum nitride (TaN) was employed instead of metal titanium (Ti).

Although Examples 1-3 and Comparative Example 1 were described employing nitrogen as the dopant gas, a similar result was obtained as described above when employing gas containing phosphorus instead of nitrogen.

The present invention is applicable to a silicon carbide crystal ingot, a silicon carbide crystal wafer, and a method for fabricating silicon carbide crystal.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide crystal ingot having a surface greater than or equal to 4 inches in diameter, comprising:
   an n-type dopant, and
   a metal atom having an atomic radius larger than the atomic radius of silicon, wherein
   said n-type dopant has a concentration greater than or equal to 1×10$^{15}$ atoms/cm$^3$ and less than or equal to 1×10$^{20}$ atoms/cm$^3$,
   said metal atom has a concentration greater than or equal to 1×10$^{14}$ atoms/cm$^3$ and less than or equal to 1×10$^{18}$ atoms/cm$^3$, and not exceeding the concentration of said n-type dopant, and
   said metal atom has a concentration gradient less than or equal to 1×10$^{17}$ atoms/(cm$^3$·mm).

2. A silicon carbide crystal wafer having a surface greater than or equal to 4 inches in diameter, obtained by being cut out from the silicon carbide crystal ingot defined in claim 1.

3. The silicon carbide crystal wafer according to claim 2, wherein an off angle of said silicon carbide crystal wafer is greater than or equal to 1° to a surface of seed crystal.

4. The silicon carbide crystal wafer according to claim 2, wherein a difference between a maximum value and minimum value of an angle between said surface of said silicon carbide crystal wafer and a normal line of a low-index plane substantially parallel to said surface of said silicon carbide crystal wafer is less than or equal to 0.5°.

5. The silicon carbide crystal wafer according to claim 4, wherein an off angle of said silicon carbide crystal wafer is greater than or equal to 1° to a surface of seed crystal.

6. A method for fabricating a silicon carbide crystal ingot, comprising the steps of:
   acid-cleaning raw material powder including a metal atom having an atomic radius larger than the atomic radius of silicon as at least one of an interstitial atom and substitutional atom in crystal of silicon carbide powder, and
   after said step of acid cleaning, vapor-phase growing a silicon carbide crystal ingot using said raw material powder.

* * * * *